US010620421B2

(12) United States Patent
Takasugi et al.

(10) Patent No.: US 10,620,421 B2
(45) Date of Patent: Apr. 14, 2020

(54) IMAGE-FORMING DEVICE, AND DIMENSION MEASUREMENT DEVICE

(71) Applicant: Hitachi High-Technologies Corporation, Minato-ku, Tokyo (JP)

(72) Inventors: Yasunori Takasugi, Tokyo (JP); Kei Sakai, Tokyo (JP); Satoru Yamaguchi, Tokyo (JP); Kazuyuki Hirao, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/221,739

(22) Filed: Dec. 17, 2018

(65) Prior Publication Data

US 2019/0121113 A1 Apr. 25, 2019

Related U.S. Application Data

(62) Division of application No. 14/377,382, filed as application No. PCT/JP2013/053170 on Feb. 12, 2013, now Pat. No. 10,197,783.

(30) Foreign Application Priority Data

Feb. 13, 2012 (JP) .................................. 2012-027963

(51) Int. Cl.
*G06T 7/00* (2017.01)
*G02B 21/36* (2006.01)
(Continued)

(52) U.S. Cl.
CPC ........... *G02B 21/367* (2013.01); *G01B 15/00* (2013.01); *G01B 15/04* (2013.01); *G02B 21/002* (2013.01);
(Continued)

(58) Field of Classification Search
CPC ...... G01B 15/00; G01B 15/04; G02B 21/002; G02B 21/367; G06K 9/6202;
(Continued)

(56) References Cited

U.S. PATENT DOCUMENTS

| 7,034,296 B2 | 4/2006 | Sato et al. | |
|---|---|---|---|
| 2003/0111602 A1* | 6/2003 | Sato | ........................ G01N 23/22 250/310 |

(Continued)

FOREIGN PATENT DOCUMENTS

| JP | 2002-15692 A | 1/2002 |
|---|---|---|
| JP | 2007-299768 A | 11/2007 |

(Continued)

OTHER PUBLICATIONS

International Search Report (PCT/ISA/210) dated Jun. 4, 2013 with English translation (nine pages).

(Continued)

*Primary Examiner* — Zhihan Zhou
(74) *Attorney, Agent, or Firm* — Crowell & Moring LLP

(57) ABSTRACT

An image forming device is provided that is capable of forming a proper integrated signal even when an image or a signal waveform is acquired from a pattern having the possibility of preventing proper matching, such as a repetition pattern, a shrinking pattern, and the like. In particular, the image forming device forms an integrated image by integrating a plurality of image signals and is provided with: a matching processing section that performs a matching process between the plurality of image signals; an image integration section that integrates the plurality of image signals for which positioning has been performed by the matching processing section; and a periodicity determination section that determines a periodicity of a pattern contained in the image signals. The matching processing section (Continued)

varies a size of an image signal area for the matching in accordance with a determination by the periodicity determination section.

5 Claims, 16 Drawing Sheets

(51) Int. Cl.
  *G06T 7/32* (2017.01)
  *H01J 37/28* (2006.01)
  *G01B 15/00* (2006.01)
  *G01B 15/04* (2006.01)
  *G02B 21/00* (2006.01)
  *G06K 9/62* (2006.01)
  *H01J 37/317* (2006.01)

(52) U.S. Cl.
  CPC .............. *G06K 9/6202* (2013.01); *G06T 7/32* (2017.01); *H01J 37/28* (2013.01); *H01J 37/3178* (2013.01); *G06T 2207/10061* (2013.01); *H01J 2237/2814* (2013.01); *H01J 2237/2817* (2013.01)

(58) Field of Classification Search
  CPC .................. H01J 37/3178; H01J 37/28; H01J 2237/2814; H01J 2237/2817; G06T 7/32; G06T 2207/10061
  See application file for complete search history.

(56) References Cited

U.S. PATENT DOCUMENTS

| | | | |
|---|---|---|---|
| 2005/0189501 A1* | 9/2005 | Sato | H01J 37/28 250/492.22 |
| 2006/0244969 A1* | 11/2006 | Ryan | G01N 21/47 356/446 |
| 2007/0171526 A1* | 7/2007 | Feron | G01S 1/70 359/470 |
| 2008/0144899 A1* | 6/2008 | Varma | G06K 9/522 382/129 |
| 2009/0087103 A1* | 4/2009 | Abe | G06K 9/6203 382/209 |
| 2009/0148051 A1* | 6/2009 | Pham | G06K 9/32 382/219 |
| 2012/0104253 A1* | 5/2012 | Tsuneta | H01J 37/20 250/307 |
| 2012/0189209 A1* | 7/2012 | Nakamura | H04N 1/4097 382/199 |

FOREIGN PATENT DOCUMENTS

| | | |
|---|---|---|
| JP | 2012-49049 A | 3/2012 |
| WO | WO 03/044821 A1 | 5/2003 |
| WO | WO 2011/007492 A1 | 1/2011 |

OTHER PUBLICATIONS

Japanese-language Written Opinion (PCT/ISA/237) dated Jun. 4, 2013 (five pages).

* cited by examiner

Search range (default) | Search range (after optimization)

Detection position candidate point | Detection position candidate point

Fig. 7
Template image
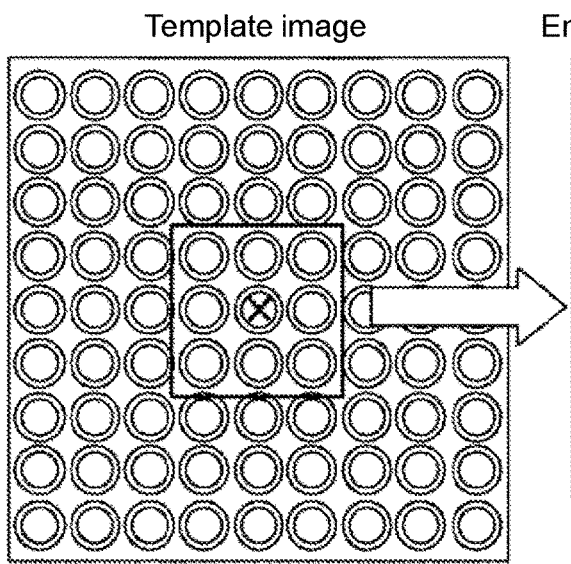
Enlarged view (around image center)
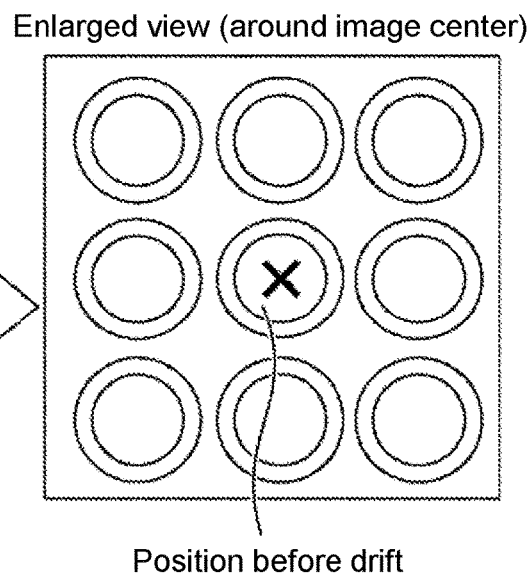
Position before drift
Search image
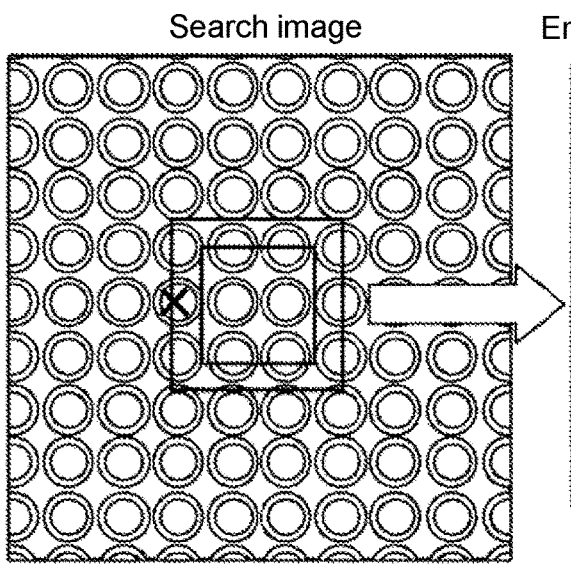
Enlarged view (around image center)
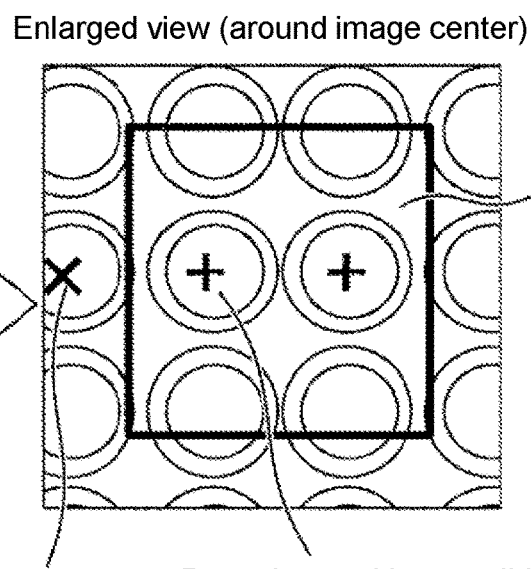
Search range
Position after drift    Detection position candidate point (n-1) frame image          n frame image (n-1)th frame y-direction corrected image n-th frame image y-direction corrected image Cross section of line pattern, and example of electron microscopic image Profile of line pattern after simple addition, and profile after weighted addition Weighted frame addition flow Profile of line pattern with corrected edge position displacement Edge position shift flow Fig. 22
Single frame image
(before position error correction)
Single frame image
(after position error correction)
Pattern center position
Pattern center position
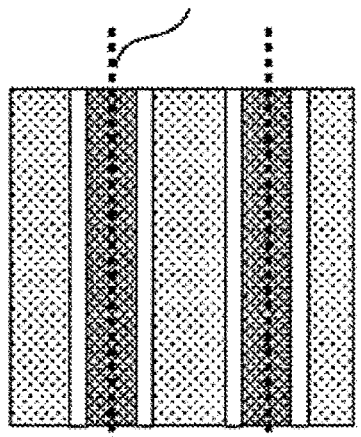
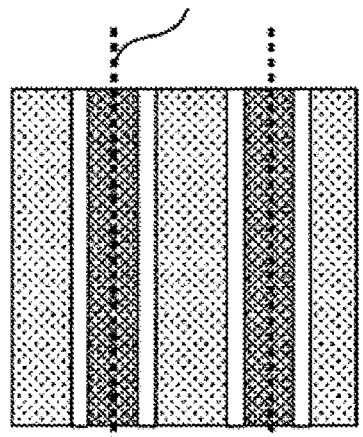
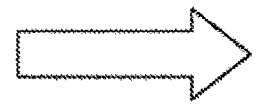
Pattern center position
corrected
Position error
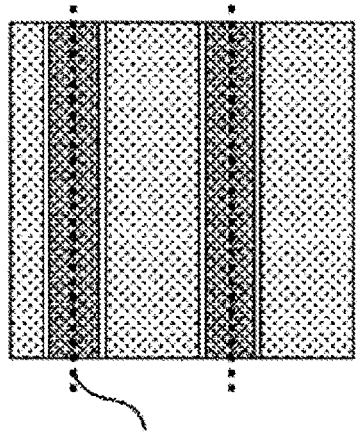
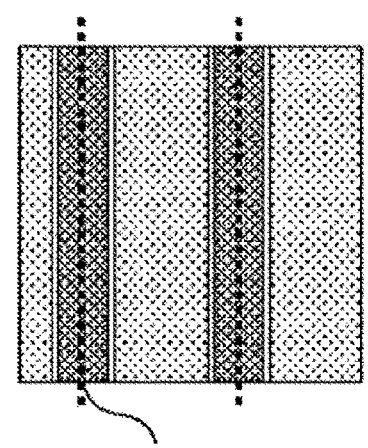
Pattern center position
(before correction)
Pattern center position
(after correction)

IMAGE-FORMING DEVICE, AND DIMENSION MEASUREMENT DEVICE

CROSS REFERENCE TO RELATED APPLICATIONS

This application is a divisional of U.S. application Ser. No. 14/377,382, filed Aug. 7, 2014, which is a National Stage of PCT International Application No. PCT/JP2013/053170, filed Feb. 12, 2013, which claims priority from Japanese Patent Application No. 2012-027963, filed Feb. 13, 2012, the entire disclosures of which are expressly incorporated by reference herein.

TECHNICAL FIELD

The present invention relates to an image forming device or a dimension measurement device that acquires an image or a signal waveform using a microscope and the like, particularly to an image forming device or a dimension measurement device that forms an image or a waveform by integrating image signals or signal waveforms.

BACKGROUND ART

In a charged particle beam device such as represented by a scanning electron microscope, a sample is scanned with a narrowly converged charged particle beam, obtaining desired information (such as a sample image) from the sample. In such a charged particle beam device, resolution is becoming increasingly higher year by year, resulting in an increase in the observation magnification ratio required for the high resolution. Beam scan methods for obtaining the sample image include a method where a plurality of images obtained by high speed scan are integrated to obtain a final target image, and a method where a target image is acquired by a single low speed scan (image capture time for one frame on the order of 40 msec to 80 msec). As the observation magnification ratio is increased, the influence of drift of the field of view on the acquired image becomes more serious. For example, in the method where the target image is acquired by integrating the image signals obtained by high speed scan on a pixel by pixel basis (frame integration), if there is a drift during image integration due to a charge-up or the like of the sample, pixels with a displaced field of view would be integrated, resulting in the target image after integration being blurred in the drift direction. In order to decrease the influence of drift, the number of integrated frames may be decreased so as to shorten the integration time; however, this makes it difficult to obtain a sufficient S/N ratio.

In the method where the image is acquired by low speed scan, if there is a drift during image capturing, the image would be deformed by the flow of the field of view in the drift direction.

When a resist pattern with high sensitivity is irradiated with charged particles by a charged particle beam device, the resist may be shrunk (contracted) by the scientific attributes of the resist. In the aforementioned method where the final target image is acquired by integrating a plurality of images obtained by high speed scan, if the shrinking occurs during image integration, pixels with a displaced edge position due to the shrinking would be integrated, resulting in a blurring at the edge of the target image after integration.

Patent Literature 1 discloses a technology where image deformation or position displacement due to a drift in a plurality of images obtained by the plurality of scans is detected by image matching, and a composed image in which the position displacement is corrected based on the detected image deformation or position displacement is generated.

CITATION LIST

Patent Literature 1: JP 2007-299768 A (corresponding to U.S. Pat. No. 7,034,296)

SUMMARY OF INVENTION

Technical Problem

Miniaturization and the like that have been achieved in semiconductor devices in recent years have led to narrower patterns and intervals between them as objects for observation or measurement. Patterns in which a plurality of continuously similar patterns are arranged (repetition pattern) as the object for observation or measurement have become more common. In the case of such patterns, because of the arrangement of a number of similar patterns, when integration is attempted on the basis of the execution of matching between image signals as objects for integration, as disclosed in Patent Literature 1, for example, there is the possibility of matching at an erroneous position, preventing appropriate execution of the integration process.

Further, some samples cause shrinking upon being irradiated with an electron beam. As a result, if image signals for a plurality of frames are acquired for integration, the edge position may be shifted before and after the shrinking, thus also preventing proper integration of the signals.

In the following, a description is given of an image forming device and a dimension measurement device with the purpose of forming a proper integrated signal even when an image or a signal waveform of a pattern that has the possibility of preventing proper matching, such as a repetition pattern or a shrinking pattern, is acquired.

Solution to Problem

According to an embodiment for achieving the objective, there is proposed an image forming device comprising an operating device that forms an integrated image by integrating a plurality of image signals obtained by a microscope, characterized in that the operating device includes a matching processing section that performs a matching process between the plurality of image signals, an image integration section that integrates the plurality of image signals for which positioning has been performed by the matching processing section, and a periodicity determination section that determines a periodicity of a pattern contained in the image signals, wherein the matching processing section varies a size of an image signal area for the matching in accordance with a determination by the periodicity determination section.

According to another embodiment for achieving the objective, there is proposed an image forming device comprising an operating device that forms an integrated image by integrating a plurality of image signals obtained by a microscope, characterized in that the operating device includes a matching processing section that performs a matching process between the plurality of image signals, an image integration section that integrates the plurality of images for which positioning has been performed by the matching, and a displacement detection section that detects a displacement between the plurality of image signals, wherein: the displacement detection section selectively detects the displacement in a specific direction of the images; the image integration section selectively corrects the displacement in the specific direction; the displacement detection section selectively detects the displacement in a direction different from the specific direction with regard to the plurality of image signals of which the displacement in the specific direction has been selectively corrected; and the image integration section forms the integrated image by selectively correcting the displacement in the direction different from the specific direction.

According to yet another embodiment for achieving the objective, there is proposed a dimension measurement device comprising an operating device that measures a dimension of a pattern formed on a sample based on an integrated signal formed by integrating a plurality of signal waveforms obtained by a microscope, characterized in that the operating device includes a matching processing section that performs a matching process between the plurality of signal waveforms, and a signal integration section that integrates the plurality of signal waveforms for which positioning has been performed by the matching process, wherein the matching processing section executes the matching such that another signal waveform shape is aligned with a certain signal waveform.

Advantageous Effects of Invention

According to the above configuration, a proper integrated signal can be formed even when an image or a signal waveform is acquired from a pattern having the possibility of preventing proper matching, such as a repetition pattern, a shrinking pattern, and the like.

BRIEF DESCRIPTION OF DRAWINGS

FIG. 7 illustrates an example in which a drift of one-half period or more is caused in a single scan in an optimized search range.

FIG. 22 illustrates an example of a method for detecting a drift amount with reference to a pattern center as a reference position.

DESCRIPTION OF EMBODIMENTS

Figure 1:
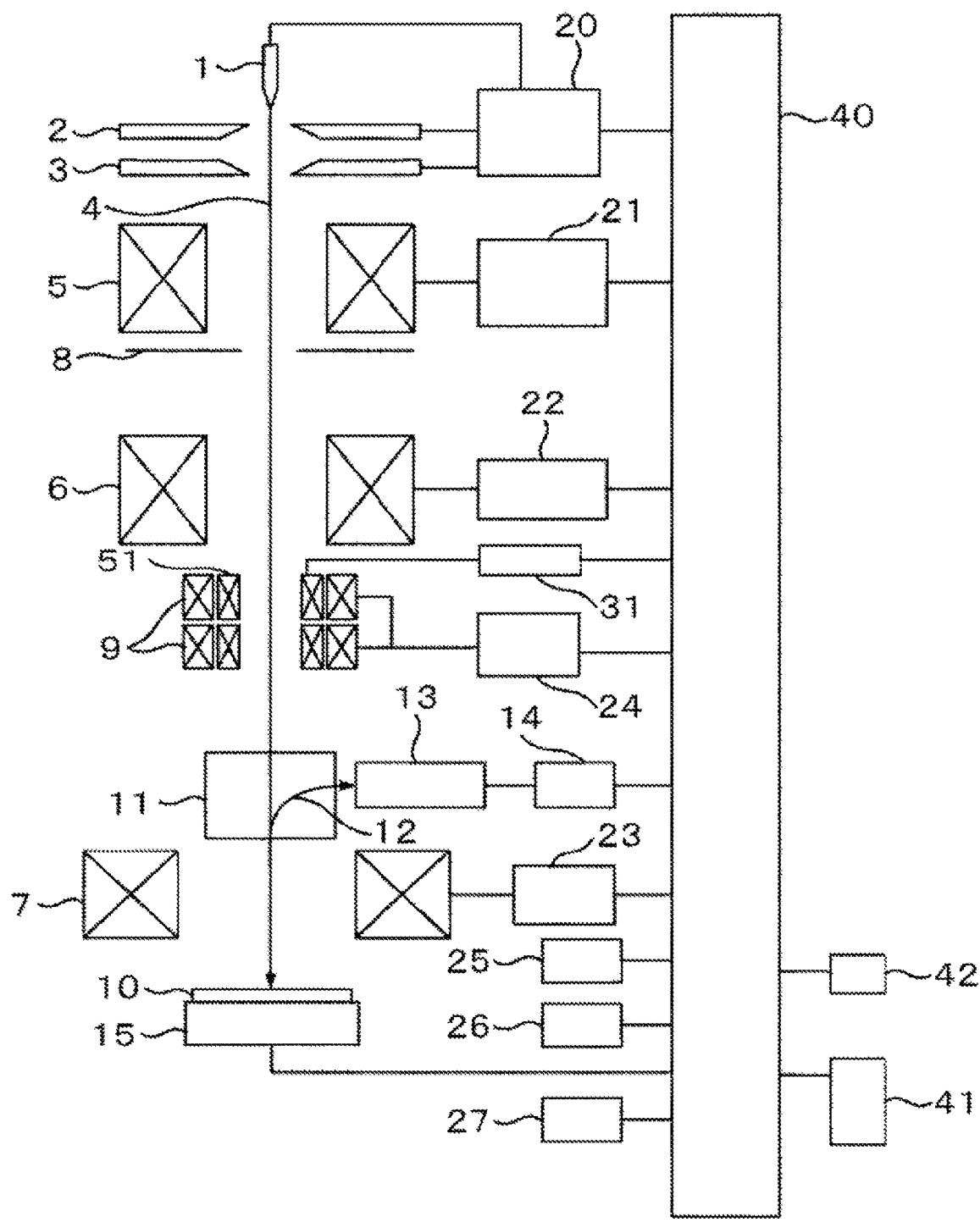
FIG. 1 is a schematic diagram of a scanning electron microscope.

In the following, a device that forms a composed signal by integrating image signals or signal waveforms for which positioning is performed by a matching process will be described in detail. Particularly, in the following embodiment, an image forming device and a dimension measurement device will be described that are suitable for forming an image or a signal waveform of a periodic pattern in which a plurality of equivalent patterns are arranged, a shrinking pattern, or the like.

When matching is performed in a case where the object subjected to normalized correlation is an image displaying a periodic pattern, a plurality of locations exist where matching scores equivalent to that of a location that is originally intended for positioning are exhibited. As a result, there is the possibility of an erroneous detection during the detection of the amount of position displacement between images unless an appropriate search area is set.

For example, if an erroneous detection occurs, a wide area of uneven contrast may be produced in a composed image composed of images based on the detected positions. Thus, there is the possibility that the measurement accuracy may be decreased in the area having the uneven contrast in the composed image.

Further, if a drift based on charge-up is caused in a line pattern, a composed image in which even roughness is recognized cannot be obtained after position displacement correction unless a position displacement in the horizontal direction with respect to the pattern is detected with high accuracy during the detection of the position displacement between images. Because the feature amount for determining a matching score is small in the horizontal direction with respect to the line pattern edge, it is difficult to detect the position displacement with high accuracy. Accordingly, when it is desired to measure even roughness of a line pattern in a composed image to which drift correction technology is applied, there is the possibility of a decrease in measurement accuracy.

Further, if the shrinking occurs during image capturing due to the influence of charged particle beam scan, the edge positions that are to be measured may be displaced when added during frame integration, resulting in a blurring in the composed image edge. Thus, in the method where the final target image is obtained by integrating a plurality of images, there is the possibility of a decrease in the measurement accuracy of the composed image.

An embodiment described below solves a new problem encountered during signal integration which is caused by the transition semiconductor devices have gone through in recent years, and relates to an image forming device and a dimension measurement device that achieve suppression of a displacement in the field of view with high accuracy while suppressing the influence of charging or shrinkage due to charged particle beam irradiation.

The embodiment described below relates to a device in which, using a sample image forming method by which a sample is scanned with a charged particle beam and an image is formed based on a secondary signal emitted from the sample, a plurality of composed images are formed by composing a plurality of images obtained by a plurality of scans, and the images are composed while correcting a position displacement between the plurality of composed images, thus forming a further composed image. The device is thus capable of forming with high accuracy an image or a signal waveform of a pattern having a feature that has the possibility of decreasing matching accuracy, such as a periodic pattern, a line pattern, a shrinking pattern, and the like.

FIG. 1 is a schematic configuration diagram of an image forming device or a dimension measurement device, or a scanning electron microscope constituting a part thereof. Between a cathode 1 and a first anode 2, a voltage is applied from a high-voltage control power supply 20 controlled by a computer 40, whereby a primary electron beam 4 is drawn from the cathode 1 with a predetermined emission current. Between the cathode 1 and a second anode 3, an acceleration voltage is applied from the high-voltage control power supply 20 controlled by the computer 40, whereby the primary electron beam 4 emitted from the cathode 1 is accelerated before proceeding to lens systems in subsequent stages.

The primary electron beam 4 is converged by a converging lens 5 controlled by a lens control power supply 21 and has an unwanted region of the primary electron beam removed by an aperture plate 8. The beam is then converged on a sample 10 as a fine spot by a converging lens 6 controlled by a lens control power supply 22 and an objective lens 7 controlled by an objective lens control power supply 23. The objective lens 7 may have various modes, such as an in-lens mode, an out-lens mode, or a snorkel mode (semi-in-lens mode). A retarding mode where a negative voltage is applied to the sample to decelerate the primary electron beam is also possible. Each of the lenses may be composed of an electrostatic lens composed of a plurality of electrodes.

The primary electron beam 4 is caused to scan the sample 10 two dimensionally (in the X-Y directions) by a scan coil 9. The scan coil 9 is supplied with current by a scan coil control power supply 24. A secondary signal 12, such as a secondary electron emitted from the sample 10 due to the primary electron beam irradiation, travels over the objective lens 7. The secondary signal 12 is separated from a primary electron by an orthogonal electromagnetic field generating device 11 for secondary signal separation, and then detected by a secondary signal detector 13. The signal detected by the secondary signal detector 13 is amplified by a signal amplifier 14, transferred to an image memory 25, and then displayed on an image display device 26 as a sample image. The secondary signal detector may be configured to detect a secondary electron or a reflected electron, or configured to detect light or an X-ray.

An address signal corresponding to a memory position in the image memory 25 is generated in the computer 40, and, after analog conversion, supplied via the scan coil control power supply 24 to the scan coil 9. When the image memory 25 has 512×512 pixels, for example, an X-direction address signal is a digital signal repeating 0 to 511. A Y-direction address signal is a digital signal repeating 0 to 511 which is incremented by one when the X-direction address signal reaches from 0 to 511. The digital signals are converted into analog signals.

Because the address in the image memory 25 corresponds to the address of the deflecting signal for primary electron beam scan, a two-dimensional image of an area in which the primary electron beam is deflected by the scan coil 9 is recorded in the image memory 25. The signals in the image memory 25 can be read successively in chronological order by a read address generation circuit (not shown) synchronized by a read clock. The signals read in accordance with the address are converted into analog signals, providing a brightness modulation signal for the image display device 26.

The image memory 25 is provided with the function for storing images (image data) for S/N ratio improvement in an overlapped (composed) manner. For example, a single completed image is formed by storing images obtained by eight two-dimensional scans in an overlapped manner. Namely, a final image is formed by composing images formed by one or more units of X-Y scan. The number of images for forming a single completed image (frame integration number) may be arbitrarily set, and thus a proper value is set in view of conditions such as secondary electron generation efficiency. It is also possible to form an image that is desired to be finally acquired by further overlapping a plurality of images formed by integrating a plurality of images. Primary electron beam blanking may be executed when or after a desired number of images has been stored, so as to interrupt the input of information to the image memory.

When the frame integration number is set to 8, there may be provided a sequence such that the first image is erased upon input of a ninth image, resulting in eight remaining images. It is also possible to perform weighted averaging such that, when a ninth image is input, the integrated image stored in the image memory is multiplied by ⅞ and the ninth image is added to the resultant image.

Two stages of deflecting coil 51 (image shift deflector) are disposed at the same position as that of the scan coil 9, so that the position (observation field of view) of the primary electron beam 4 over the sample 10 can be two dimensionally controlled. The deflecting coil 51 is controlled by a deflecting coil control power supply 31.

The stage 15 can move the sample 10 in at least two directions (the X-direction and the Y-direction) in a plane perpendicular to the primary electron beam.

Via the input device 42, image capturing conditions (scan speed, number of integrated images), the field of view correction mode, and the like can be designated. Also, image output or save and the like may also be designated.

The device illustrated in FIG. 1 is provided with the function of forming a line profile on the basis of the detected secondary electron or reflected electron, for example. The line profile is formed on the basis of the amount of electron detected during one- or two-dimensional scan of the primary electron beam, sample image brightness information, and the like. The obtained line profile is used for dimension measurement of the pattern formed on the semiconductor wafer, for example. The device according to the present embodiment may be further provided with an interface 41 for transferring image data to an external device or the like, or with a recording device 27 for storing image data in a predetermined storage medium.

While FIG. 1 is described on the assumption that the control device is integral or virtually integral with the scanning electron microscope, the present invention is not limited to such embodiment. For example, a control processor provided separately from the scanning electron microscope body may perform a process as will be described below. In this case, there will be required a transmission medium for transmitting a detection signal detected by the secondary signal detector 13 to the control processor or for transmitting a signal from the control processor to the lenses, deflector, and the like of the scanning electron microscope, and an input/output terminal for the input and output of signals transmitted via the transmission medium.

A program for performing a process which will be described below may be registered in the storage medium, and the program may be executed by the control processor having an image memory and supplying required signals to the scanning electron microscope. Namely, the embodiment which will be described below may be implemented in the form of a program that can be adopted in the charged particle beam device of the scanning electron microscope and the like provided with an image processor.

Figure 23:
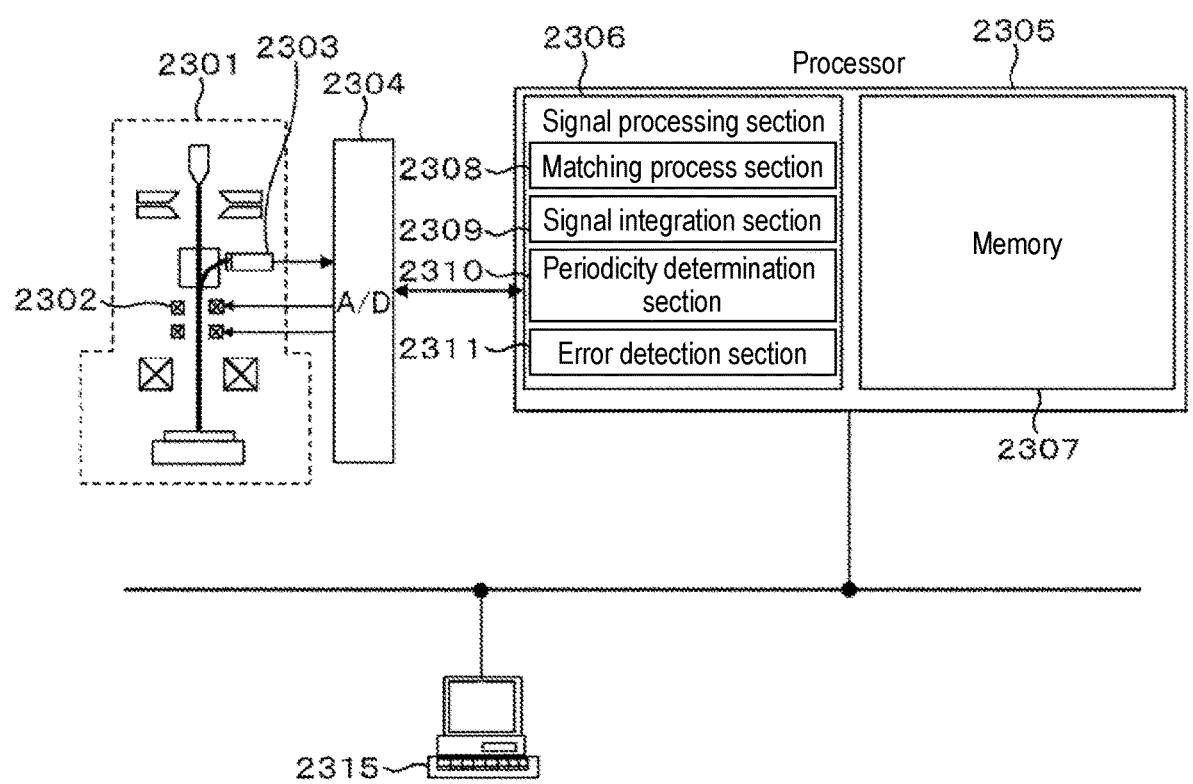
FIG. 23 illustrates the outline of an image forming system or a dimension measurement system using a scanning electron microscope.

FIG. 23 illustrates a mode of the image forming device or dimension measurement device including the scanning electron microscope. The present system includes an SEM body 2301, an A/D converter 2304, an operating device (including a signal processing device 2306 for performing an image process) 2305.

The SEM body 2301 irradiates a sample, such as a wafer with an electronic device produced thereon, with an electron beam, captures electrons emitted from the sample with a detector 2303, and converts the signal into a digital signal in the A/D converter 2304. The digital signal is input to the operating device 2305 and stored in a memory 2307. An image process for the particular purpose is performed by image processing hardware in the signal processing section 2306, such as a CPU, an ASIC, or an FPGA. The signal processing section 2306 is also provided with the function of creating a line profile on the basis of the detection signal and measuring a peak-to-peak dimension of the profile.

The operating device 2305 is further connected to an input device 2315 including an input means, and has the function of causing a display device of the input device 1108 to display an image, an inspection result, or the like for the operator.

The controls or processes in the operating device 2305 may be partly or entirely assigned to an electronic computer or the like provided with a CPU and a memory for storing images for processing or control. The input device 2315 also functions as an image recipe creation device for creating, either manually or by utilizing electronic device design data, an image recipe including the coordinates of an electronic device required for inspection, pattern matching templates used for positioning, photography conditions, and the like.

The input device 2315 is provided with a template creation section for creating a template by cutting out a part of a diagram image formed on the basis of design data. The created template is registered in the memory 2305 as a template for template matching in a matching processing section 2306 contained in the signal processing section 2306. Template matching is a technique for identifying locations where a photographed image as the object for positioning and the template are aligned with each other on the basis of coincidence degree determination using normalized correlation process, for example. The matching processing section 2308 identifies a desired position of the photographed image on the basis of the coincidence degree determination.

A signal integration section 2309 integrates the signals before integration that are registered in the memory 2307 or acquired by the scanning electron microscope. A periodicity determination section 1310 analyzes the frequency component of the acquired image or signal waveform by autocorrelation method or the like. The periodicity determination section 1310 determines periodicity with respect to specific directions (the X-direction, the Y-direction) and, upon determining that there is periodicity, transmits the determination result to the matching processing section 1308.

In the matching processing section 1308, a size of an image area for matching is set on the basis of the determination result and the conditions stored in the memory 2307. For example, when it is determined that there is no periodicity, a pre-stored size of image area, or an image area greater than the pre-stored image area is selected. On the other hand, when it is determined that there is periodicity, a pre-stored size of image area, or an image area smaller than the pre-stored image area is selected. Thus, when it is determined that there is periodicity, a relatively small image area is set. Preferably, when it is determined that there is periodicity, the size of the image area may be limited to a range such that two or more patterns of the same shape are not included, so that the image area does not include a plurality of locations suspected of having a high matching score. Preferably, in the absence of periodicity, the image area may be relatively widened so as to enable matching using an image area including a more complex pattern shape.

A displacement detection section 1311 detects a displacement in a specific direction using an autocorrelation method, for example. For example, in the case of a line pattern extending in the Y-direction, when a brightness distribution (profile waveform) in the X-direction is detected, a peak is present at an edge portion. Thus, the amount of displacement is evaluated by performing autocorrelation between a waveform acquired in a certain frame and a waveform acquired at a different timing. In the case of the line pattern, when a displacement in the X-direction is detected, noise component can be decreased by adding signal waveforms of different positions in the Y-direction and averaging them. Further, when a displacement in the Y-direction is detected, a waveform indicating the frequency component of roughness of a pattern at an edge portion may be formed, and a displacement between waveforms acquired in different frames may be determined by mutual correlation method.

In the embodiment described below, a control device mounted in the SEM, or a control device (input device 1315) connected to the SEM via a communication line and the like will be described by way of example. However, this is not a limitation, and the processes described below may be performed using a general-purpose operating device that executes an image process in accordance with a computer program. Further, the technique described below may be applied to other charged particle beam devices, such as a focused ion beam (FIB) device.

Embodiment 1

Figure 2:
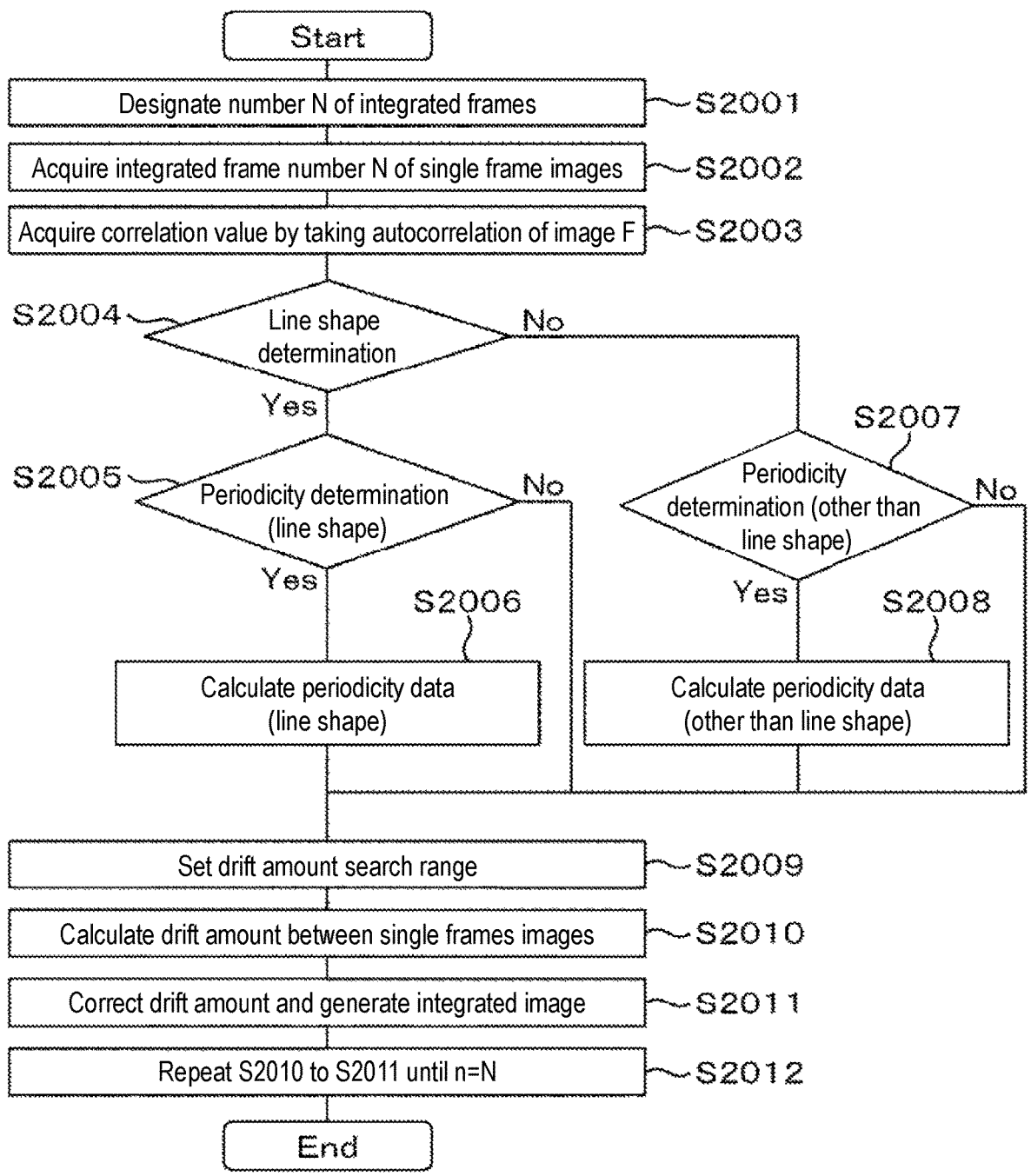
FIG. 2 is a flow chart showing the steps for setting a search area by pattern periodicity determination.

In an embodiment directed to a method for improving S/N ratio by integrating TV scan images, a process flow of FIG. 2 will be described below. In the present embodiment, by adopting the technique described below when a TV scan image has a position displacement due to a drift, it becomes possible to optimize a search range on the basis of the pattern shape, structure, or the like of the TV scan image, and to detect the position displacement and generate a composed image in which the position displacement is corrected. The following process is executed by the computer 40 or the operating device 2305, for example.

First Step (S2001):

A frame integration number N is designated via the input device 42.

Second Step (S2002):

When an instruction for starting image capture is entered via the input device 42, the frame integration number N of single frame images F (F1, F2, F3, . . . , FN) are continuously acquired from the same field of view and set in a memory area.

Figure 3:
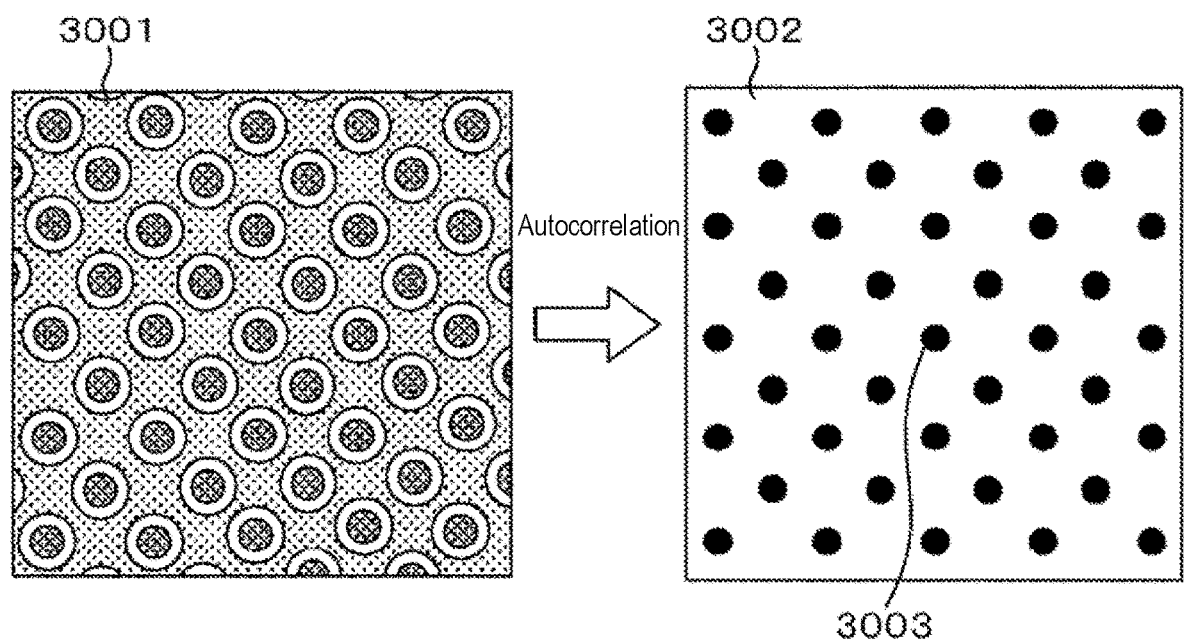
FIG. 3 illustrates an example of a correlation value distribution result obtained by taking the autocorrelation of a single frame image.

Third Step (S2003):

As illustrated in FIG. 3, the autocorrelation of the single frame image data 3001 is taken to acquire a correlation value distribution 3002 of the single frame image. The peak (maximum value) of the correlation values at a detection position 3003 where the correlation value is high is utilized for pattern shape or periodicity determination.

Figure 4:
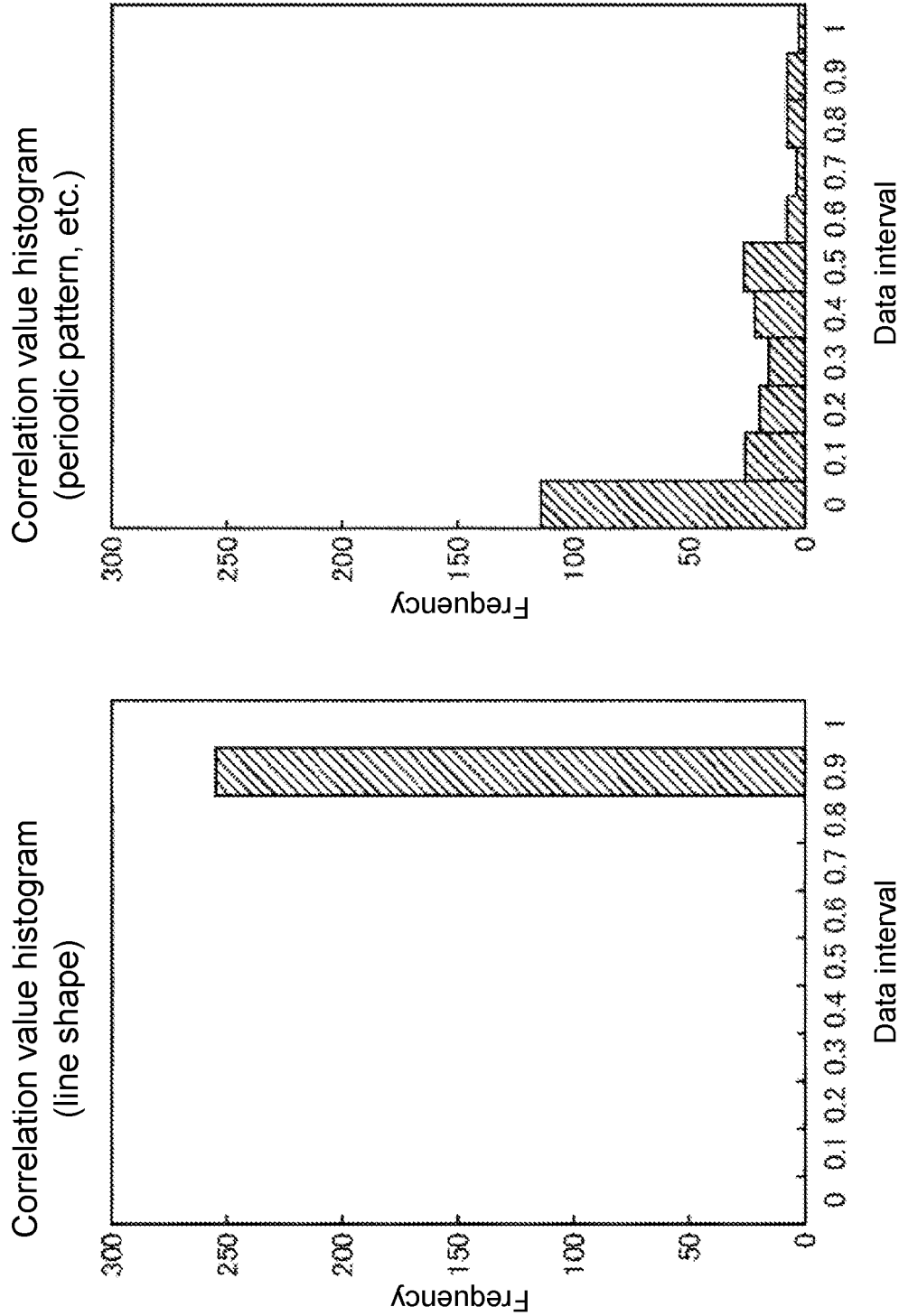
FIG. 4 illustrates histograms of correlation values acquired one-dimensionally from a maximum correlation value detected position.

Fourth Step (S2004):

Pattern shape determination is performed on the basis of the correlation value data acquired in the third step. First, a histogram of correlation values in the horizontal and vertical directions from the highest correlation value detected position is created. In the created histogram, if the data is concentrated in a specific section as illustrated in FIG. 4, it is determined that a line shape is exhibited in the detection direction.

If it is determined that either the X- or Y-direction is the line shape, the process of a fifth step is performed. If it is determined that the line shape is not in the X- or Y-direction, the process of a seventh step is performed.

Fifth Step (S2005)

In the case of a line shape, periodicity determination is performed. From the highest correlation value detected position, correlation values are one-dimensionally acquired with respect to a direction that was not determined to be the line shape, and the peak (maximum value) of the correlation values is calculated. For example, in the case of a vertical line pattern, the X-direction correlation values are acquired. In the case of a horizontal direction line pattern, the Y-direction correlation values are acquired.

The acquired correlation values are filtered by a certain specific threshold value, and the peak of the correlation values is calculated. If there is a plurality of peaks, it is determined that there is periodicity. If there is one peak of the correlation values, it is determined that there is no periodicity.

Sixth Step (S2006)

If it is determined that the pattern is a line shape and there is periodicity, peak-to-peak distances of the correlation values are averaged to provide period data.

Seventh Step (S2007)

In the case of a pattern other than a line shape, periodicity determination is performed. The correlation values acquired from the correlation distribution data 3002 of FIG. 3 are filtered by a certain specific threshold value, and it is determined if there is a correlation value peak (maximum value). If there is a plurality of correlation value peaks, it is determined that there is periodicity. If there is one correlation value peak, it is determined that there is no periodicity.

Eighth Step (S2008)

Figure 5:
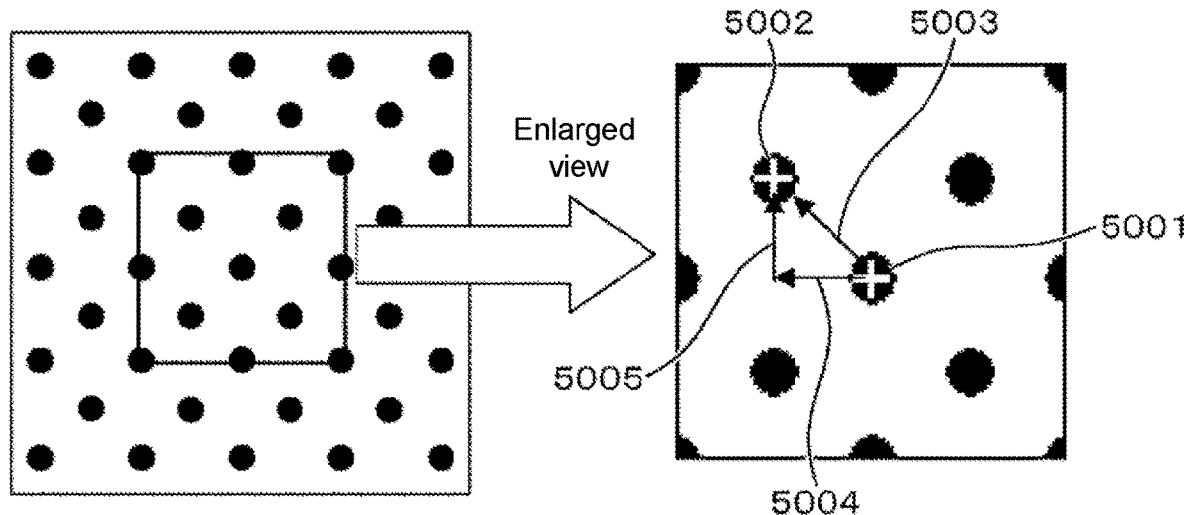
FIG. 5 illustrates a method for determining period data in a pattern having periodicity other than a line shape.

If it is determined that the pattern is other than a line shape and there is periodicity, the position of detection of the peak of a correlation value 5002 positioned at a shortest distance excepting the peaks of the correlation values in the horizontal direction and the vertical direction is acquired from a detection position 5001 with the highest correlation value as illustrated in FIG. 5. A distance 5003 between the two points is resolved into an X-direction component 5004 and a Y-direction component 5005, thus providing X-direction and Y-direction period data.

Figure 6:
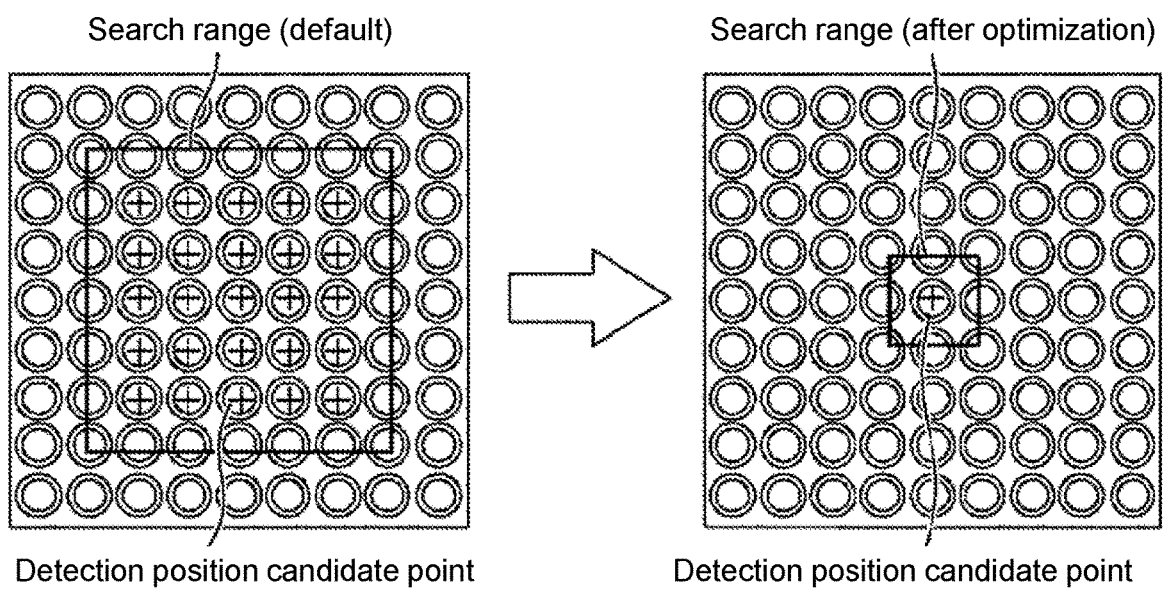
FIG. 6 illustrates an example of optimization of a search range in a pattern having periodicity.

Ninth Step (S2009):

If it is determined in the fifth step or the seventh step that there is periodicity in the pattern structure, the acquired X- and Y-direction periodicity data is set as a drift amount search range, as illustrated in FIG. 6. If the periodicity data calculated in the sixth step or the eighth step is set as the search range as is, an adjacent pattern may be detected. Thus, a slightly narrowed range of periodicity data is set as the search range.

If it is determined in the fifth step or the seventh step that there is no periodicity in X- or Y-direction, a default value is set in the search range. The search range may be set to an arbitrary value set by the user.

Tenth Step (S2010):

The search range calculated in the ninth step is set, and the amount of position displacement is detected based on a combination of adjacent single frame images F(n−1) and F(n). The amount of position displacement in pattern detection may be calculated from normalized mutual correlation and the like.

The detected amount of position displacement is accumulated with the amount of position displacement with respect to a reference image as the object for integration. A detection method adapted for the information of the pattern shape determined in the fourth step may be adopted.

Eleventh Step (S2011):

A single frame image in which the amount of position displacement from the reference image as calculated in the tenth step is corrected is generated and added to the reference image, generating an integrated image.

Twelfth Step (S2012):

The tenth step and the eleventh step are repeated until the frame integration number N is reached.

In the present embodiment, when one half period or more of drift occurs in a single electron beam scan by low speed scan or the like, as illustrated in FIG. 7, pattern detection is performed in the optimized search range. When a number of patterns are measured at once although the composed positions may differ from the actual pattern, measurement results from a plurality of patterns are often averaged. Thus, no problem would be caused in the measurement result even if the overlapped position is displaced by one period.

Figure 8:
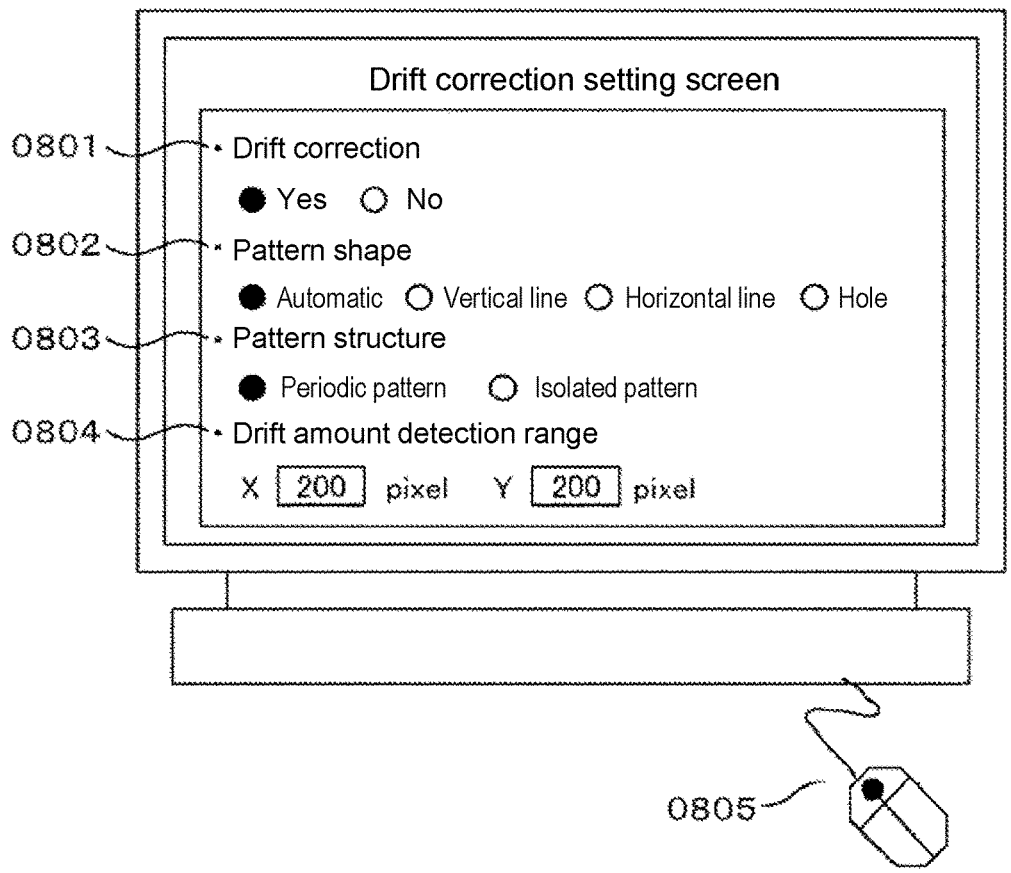
FIG. 8 illustrates an example of a GUI screen displayed on an image display device.

The device according to the present embodiment also provides a mechanism for entering input settings of correction object pattern shape, structure, and position displacement search range as prior information of the selection of the necessity 0801 of applying the image drift correction technology or drift correction application on a graphical user interface (GUI), so that the application of the drift correction technology can be chosen by the operator as illustrated in FIG. 8. When a pattern shape 0802, a structure 0803, and search range information 0804 are set on the GUI in advance, the third to eighth steps of the present embodiment may be omitted.

Figure 11:
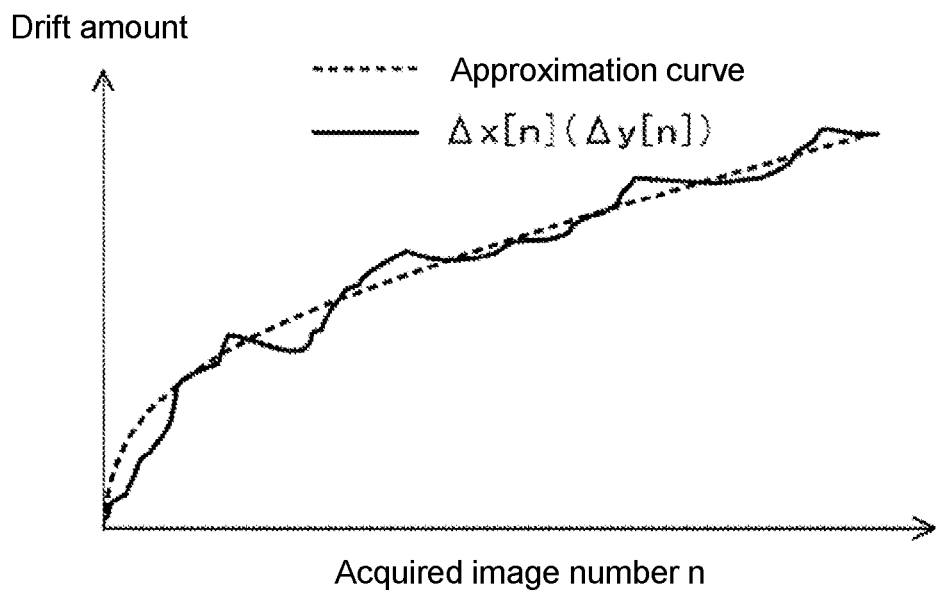
FIG. 11 illustrates a detected drift amount and an example of fitting of the drift amount by an approximation curve.

FIG. 11 illustrates an example in which the selections are made using a pointing device 0805 or the like on the image display device. However, this is not a limitation, and the settings may be made using other known input setting means.

Embodiment 2

Figure 9:
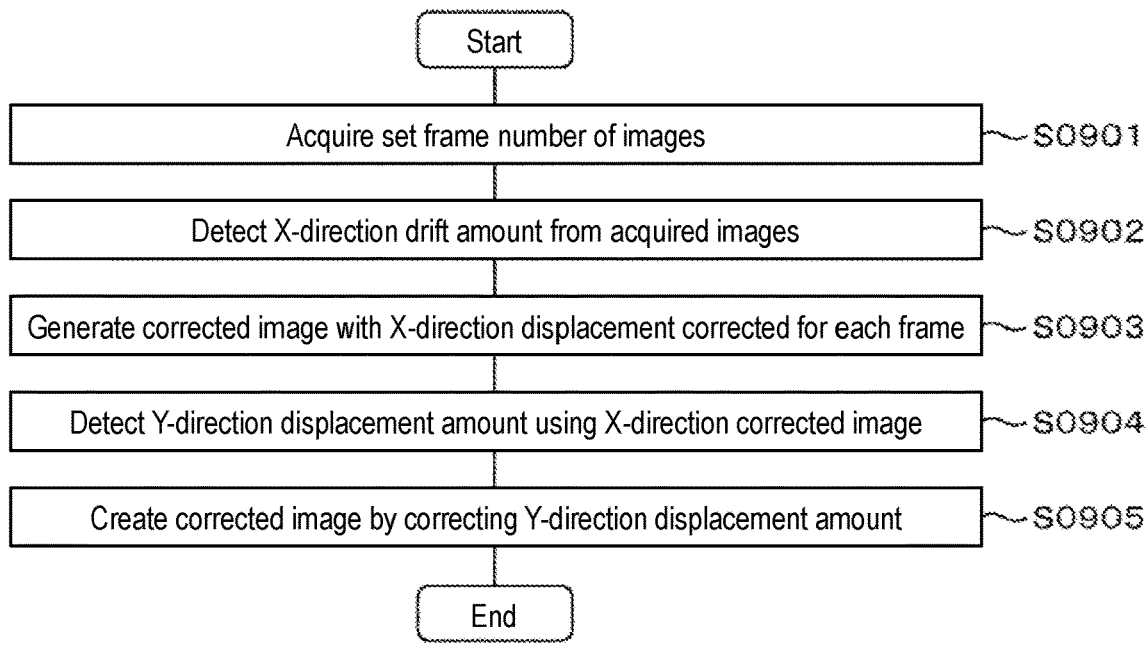
FIG. 9 is a flow chart of a drift correction method adapted for line pattern roughness measurement.

An embodiment will be described in which the drift correction technology is applied when an image acquired by a particle beam scan in the X-direction in a vertical line pattern is drifted in the X- and Y-directions. The present embodiment will be described with reference to a process flow of FIG. 9, and a supplementary description will be given with reference to FIGS. 10 to 13.

First Step (S0901):
N images such that sufficient pattern S/N can be obtained are acquired on a frame by frame basis.

Second Step (S0902):
The amount of drift in the X-direction is detected using an (n−1)th frame image and an (n)th frame image.

Figure 10:
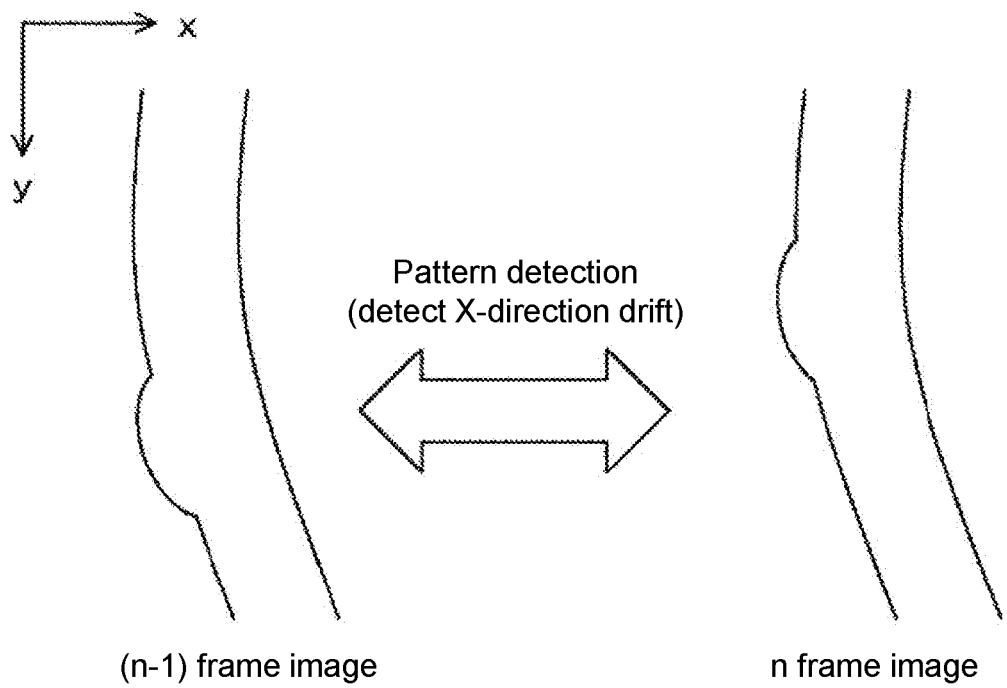
FIG. 10 illustrates an example of a drift in X- and Y-directions of an image acquired by scanning a line pattern with a charged particle beam in the X-direction.

When there is the influence of drift, the line pattern may appear deformed, as illustrated in FIG. 10. If the Y-direction drift detection is performed with such image, pattern detection would be subject to the influence of drift. Thus, in the first step, the amount of displacement only in the X-direction is detected. The amount of drift may be calculated from the amount of position displacement in pattern detection. The amount of position displacement in pattern detection may be calculated from a normalized mutual correlation or the like.

In order to determine an approximation curve from the cumulative total of the drift amount, a cumulative total of a drift amount Δx in the X-direction up to (n)th frame is calculated. When the drift amount Δx in the X-direction has been calculated for N frames, Δx is fitted by the approximation curve. FIG. 11 shows a graph of the drift amount and its approximation curve. When the drift is due to the influence of charging, a tendency is such that the drift amount is large immediately after the start of image acquisition and then gradually converges thereafter. Thus, the approximation curve can be approximated using log approximation or polynomial approximation.

Figure 12:
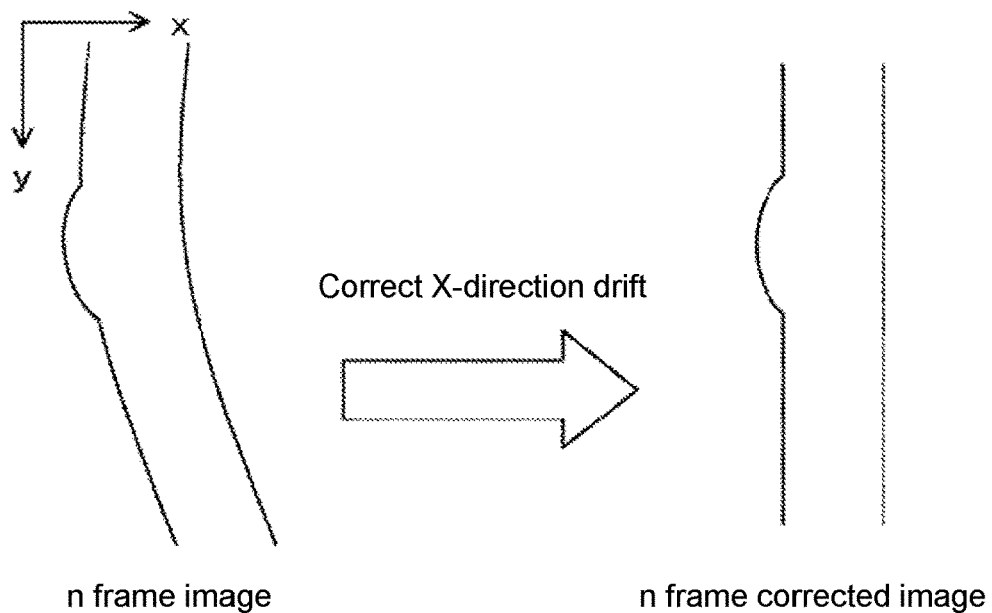
FIG. 12 illustrates an example of correction of an X-direction position displacement of a single frame image in a line pattern.

Third Step (S0903):
From the approximation curve of Δx, a corrected image for the first to N frames corrected in the X-direction is generated. As illustrated in FIG. 12, by performing correction in the X-direction, the drift occurring in a single frame can be corrected, while the Y-direction correction enables correction well utilizing the pattern roughness.

Figure 13:
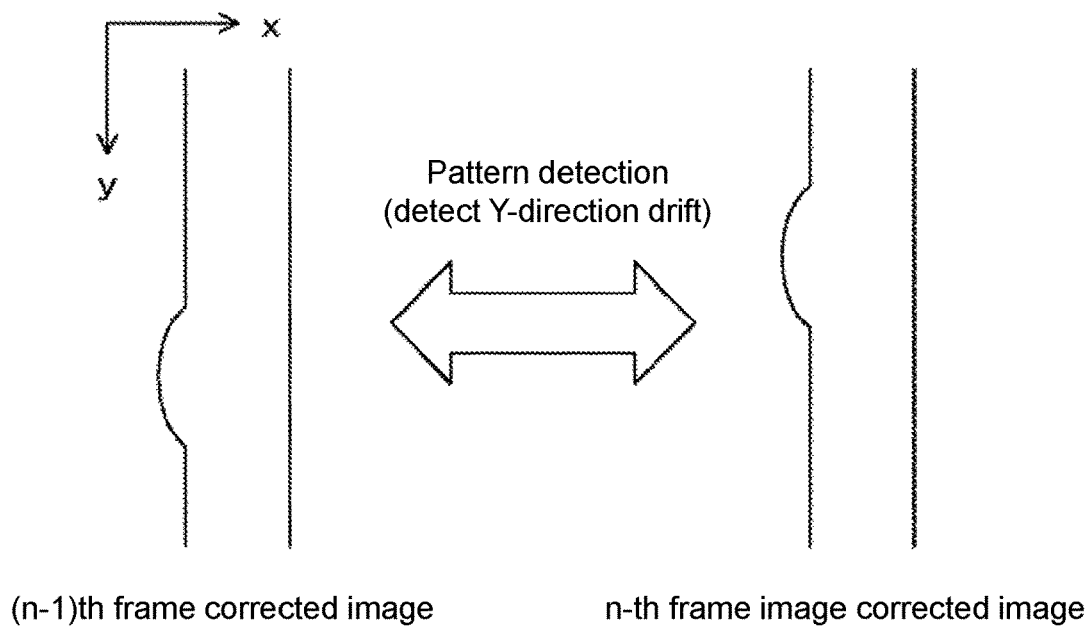
FIG. 13 illustrates an example of detection of a Y-direction position displacement using the single frame image in which the X-direction position displacement has been corrected.

Fourth Step (S0904):
Thereafter, the amount of drift in the Y-direction is detected using the corrected image for the N frames in which the X-direction drift has been corrected, as illustrated in FIG. 13. As in the X-direction, a cumulative total of the drift amount is calculated in advance for the Y-direction. After the detection of the drift amount for the N-th frame is completed, the cumulative total of the drift amount is fitted by an approximation curve, as in the X-direction.

Figure 14:
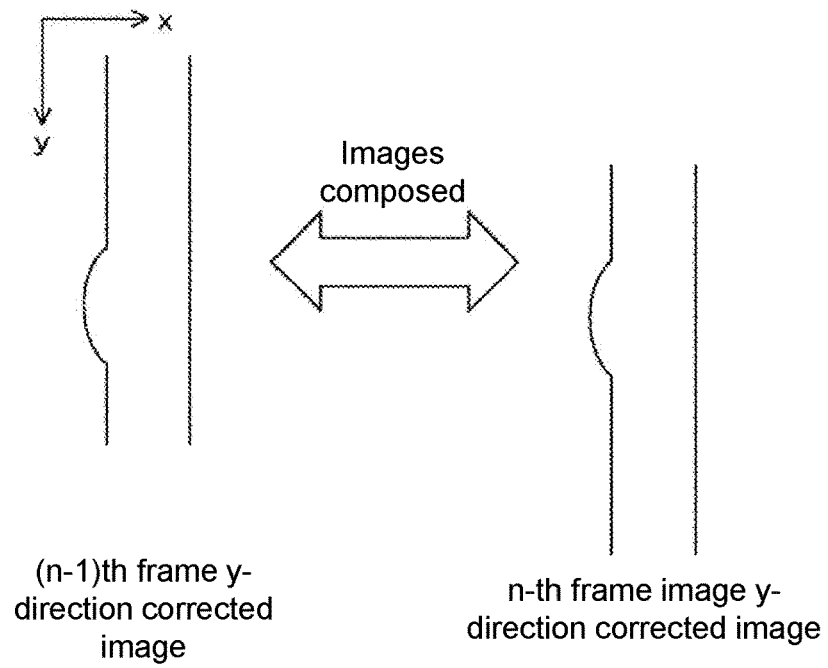
FIG. 14 illustrates an example of correction of a Y-direction position displacement of a line pattern using pattern roughness.

Fifth Step (S0905):
A composed image composed of N frames is generated while the drift in the Y-direction is corrected on the basis of the approximation curve determined as illustrated in FIG. 14, and then the process ends. Thus, the X-direction and the Y-direction are corrected separately, whereby the Y-direction can also be accurately corrected by utilizing the pattern roughness.

Embodiment 3

An embodiment will be described in which an edge position displacement of an integrated image is caused by shrinkage in the method for improving the S/N ratio by integrating the TV scan image.

By modifying the weighting during frame integration, the influence of edge blurring due to shrinkage is reduced. It is also possible to create a composed image in which the edge position is corrected by detecting an edge displacement between individual frames.

Figure 15:
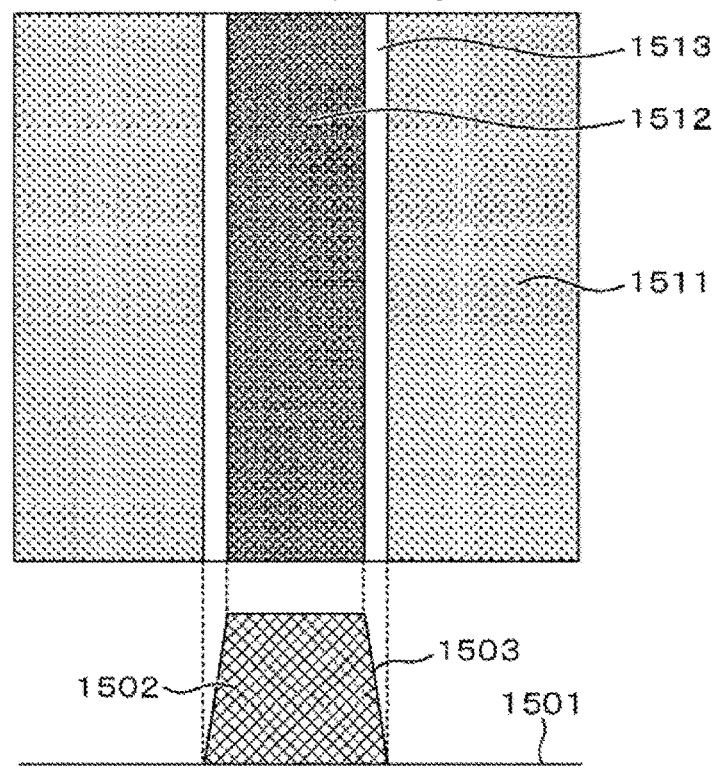
FIG. 15 is a cross sectional view of a line pattern, illustrating an example of an electron microscope image.
Figure 16:
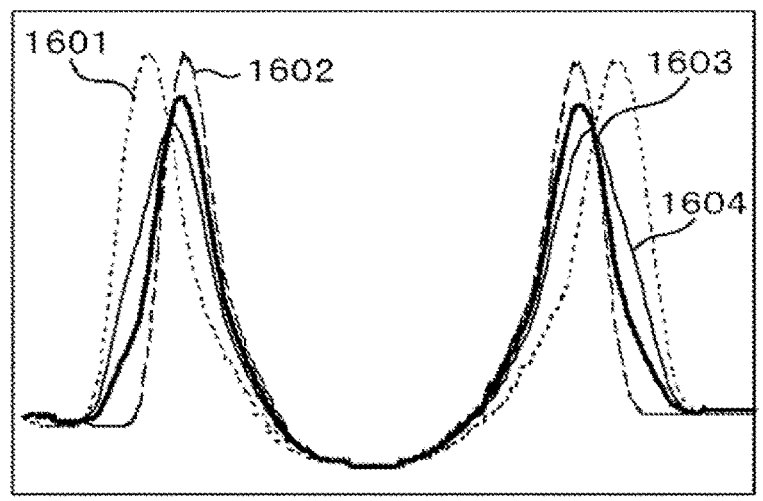
FIG. 16 illustrates a profile of a line pattern after simple addition and a profile after weighted addition.

With reference to FIG. 15 and FIG. 16, a system for modifying the added weight during frame integration will be described. FIG. 15 is a cross sectional view of a semiconductor line pattern, illustrating an example of an electron microscope image. A resist line pattern 1502 formed on a substrate 1501 and having an edge 1503 is observed as a pattern portion 1512 and an edge portion 1513 in the electron microscope image. The electron microscope image 1511 is an image of the line pattern 1502 as observed from above.

When a dimension of the line pattern of FIG. 15 is measured, a profile as illustrated in FIG. 16 is created from the electron microscope image 1511, and then a characteristic position, such as a differential peak of the edge portion 1513, is captured. Generally, a method is employed where the characteristic position is detected with respect to the left and right edges, and their distance is determined as a pattern dimension. A profile obtained in a pattern from which shrinking occurs provides a simple additional profile 1604 based on the addition of a profile 1601 for the initial period of shrinking and a profile 1602 for the latter period of shrinking. When the dimension is measured in such profile, the edge portions of the profile become blurred, destabilizing the characteristic position and decreasing measurement reproducibility as well.

Figure 17:
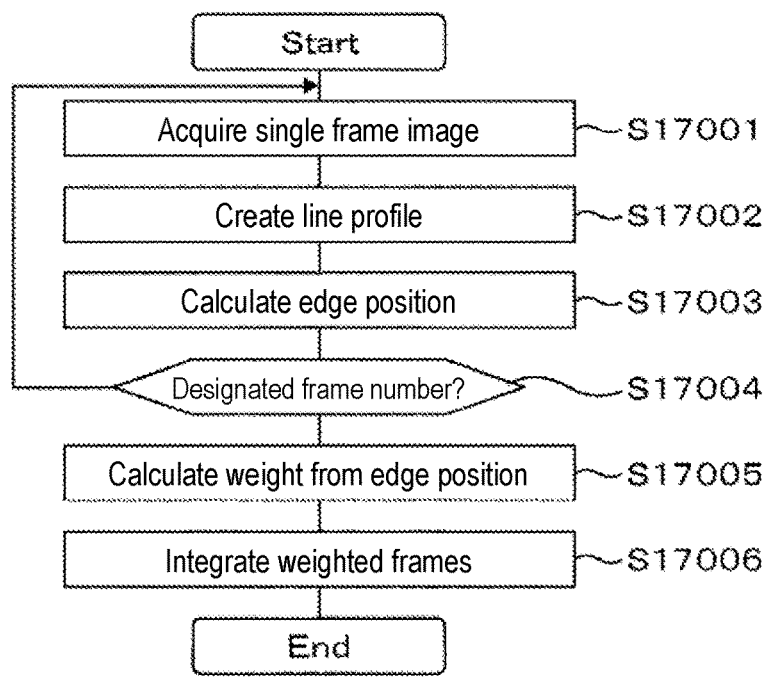
FIG. 17 is a flow chart of a method for creating an integrated image with a varied weight added to the profile for the latter period of shrinkage.

FIG. 17 illustrates a flow for creating an integrated image of a profile 1603 in which the added weight is varied between the profile 1601 for the initial period of shrinking and the profile 1602 for the latter period of shrinking. In the following, each step will be described.

First Step (S17001):
When image acquisition is started, a single frame image is captured into the image memory 25.

Second Step (S17002):
A line profile is created by the computer 40.

Third Step (S17003)
A characteristic position is detected from the obtained profile as an edge, and information of its position is stored in the computer 40.

Fourth Step (S17004)
The process of S17001 to S17003 is repeated for the designated number of frames.

Fifth Step (S17005)
The amount of displacement in the edge positions between the respective frames is calculated from the edge position of each frame, and the total amount of displacement is divided by the amount of displacement between the respective frames, providing a weight. Namely, the weight W(x) of each frame is expressed by the following expression.

$$W(x)=St/S(x) \quad (1)$$

where St is the total amount of displacement and S(x) is the amount of displacement between the respective frames.

It is known that the amount of shrinking changes exponentially. In this case, expression (1) can be expressed, using the designated number N of added frames, as follows:

$$W(x,N)=(2x+1)/(N(N+2)) \quad (2)$$

Sixth Step (S17006):

When frame addition is implemented by multiplying the weight according to expression (1) or expression (2) by each frame image, an integrated image that takes the shrinking amount into consideration can be obtained. With regard to the weight W(x), an empirically determined arbitrary value may be used.

Figure 18:
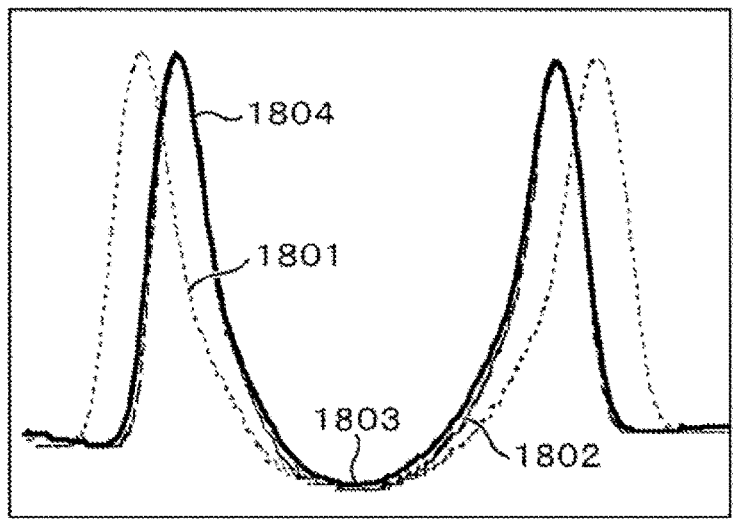
FIG. 18 illustrates a profile of a line pattern in which an edge position displacement has been corrected.
Figure 19:
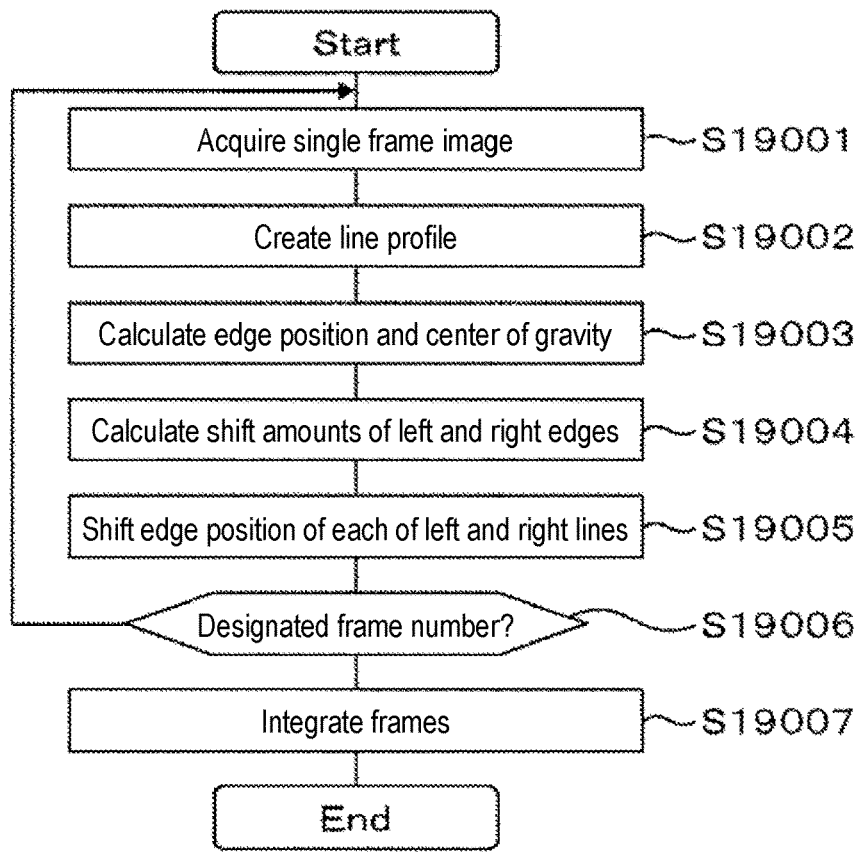
FIG. 19 is a flow chart of a mode for creating a composed image in which the edge position is corrected by detecting an edge displacement between frames due to shrinkage.

Next, a system for creating a composed image in which the edge position is corrected by detecting an edge displacement between frames will be described. As illustrated in FIG. 18, profiles obtained from a pattern in which shrinking occurs are almost identical in shape, such as a profile 1801 for the initial period of shrinkage and a profile 1802 for the latter period of shrinkage. However, the shape is shrunk from the center of the pattern. Thus, the shape is divided into left and right portions by determining a center of gravity 1803 of the profile 1801 for the initial period of shrinkage. With respect to the left and right edge profiles, correlation values with the profile 1802 for the latter period of shrinkage are computed, and the profiles are overlapped at positions with the highest correlation value. Alternatively, the highest positions or differential peaks of the profiles may be aligned. By finding an arithmetic mean of the aligned left and right edges, a line profile 1804 is obtained. Similarly, the alignment may be with the profile for the initial period of shrinkage. The above flow will be described with reference to FIG. 19.

First Step (S19001):

When image acquisition is started, a single frame image is captured into the image memory 25.

Second Step (S19002):

A line profile is created by the computer 40.

Third Step (S19003):

An edge position and the center of gravity of the obtained profile are computed.

Fourth Step (S19004):

Information of the position and the center of gravity is stored in the computer 40.

Fifth Step (S19005):

Then, the amount of displacement from the profile of a preceding frame that has been stored is calculated to shift the edge position.

Sixth Step (S19006):

The process from S19001 to S19005 is repeated for the designated number of frames.

Seventh Step (S19007):

The frame images with the shifted left and right edges are averaged to provide a composed image.

Figure 20:
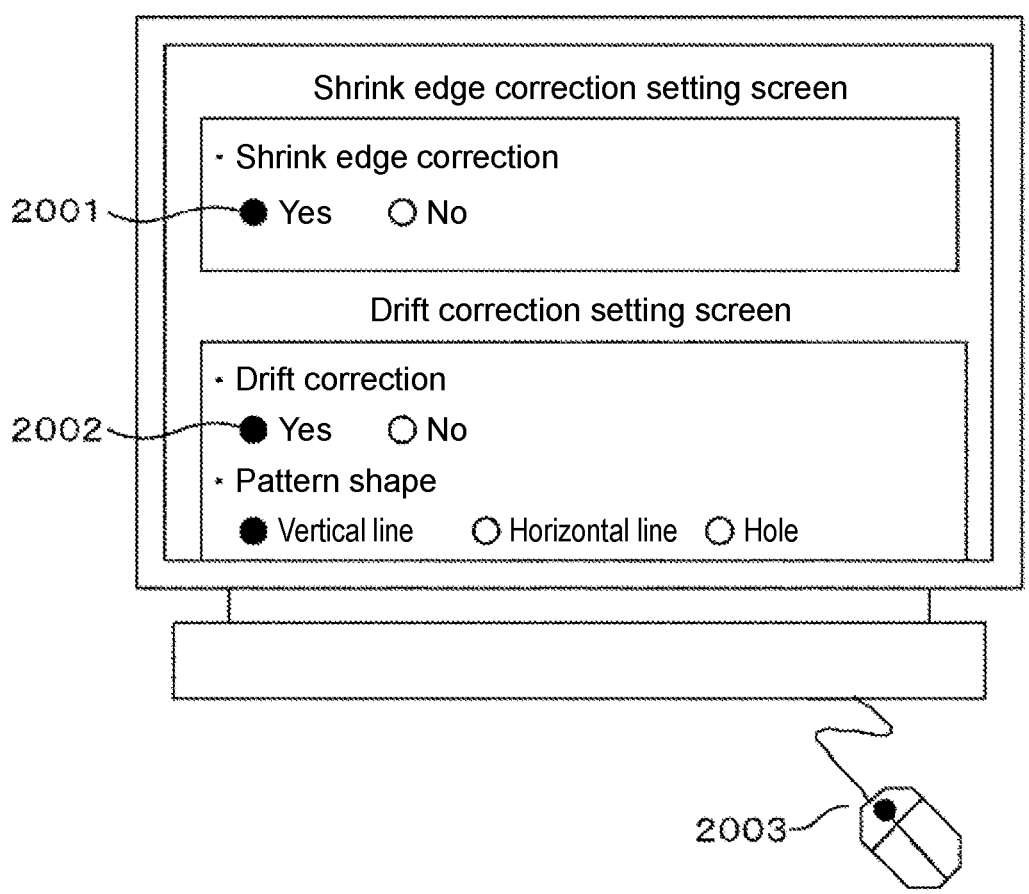
FIG. 20 illustrates an example of a GUI screen for shrink edge correction displayed on an image display device.

The device according to the present embodiment is also provided with a mechanism enabling the selection of the necessity 2001 of application of shrink edge correction on a graphical user interface (GUI), so that the operator can choose to apply the shrink edge correction, as illustrated in FIG. 20. A setting in combination with a drift correction 2002 is also possible. While FIG. 20 illustrates the example allowing the selections using a pointing device 2003 and the like on an image display device, this is not a limitation, and the settings may be made using other known input setting means.

Embodiment 4

Figure 21:
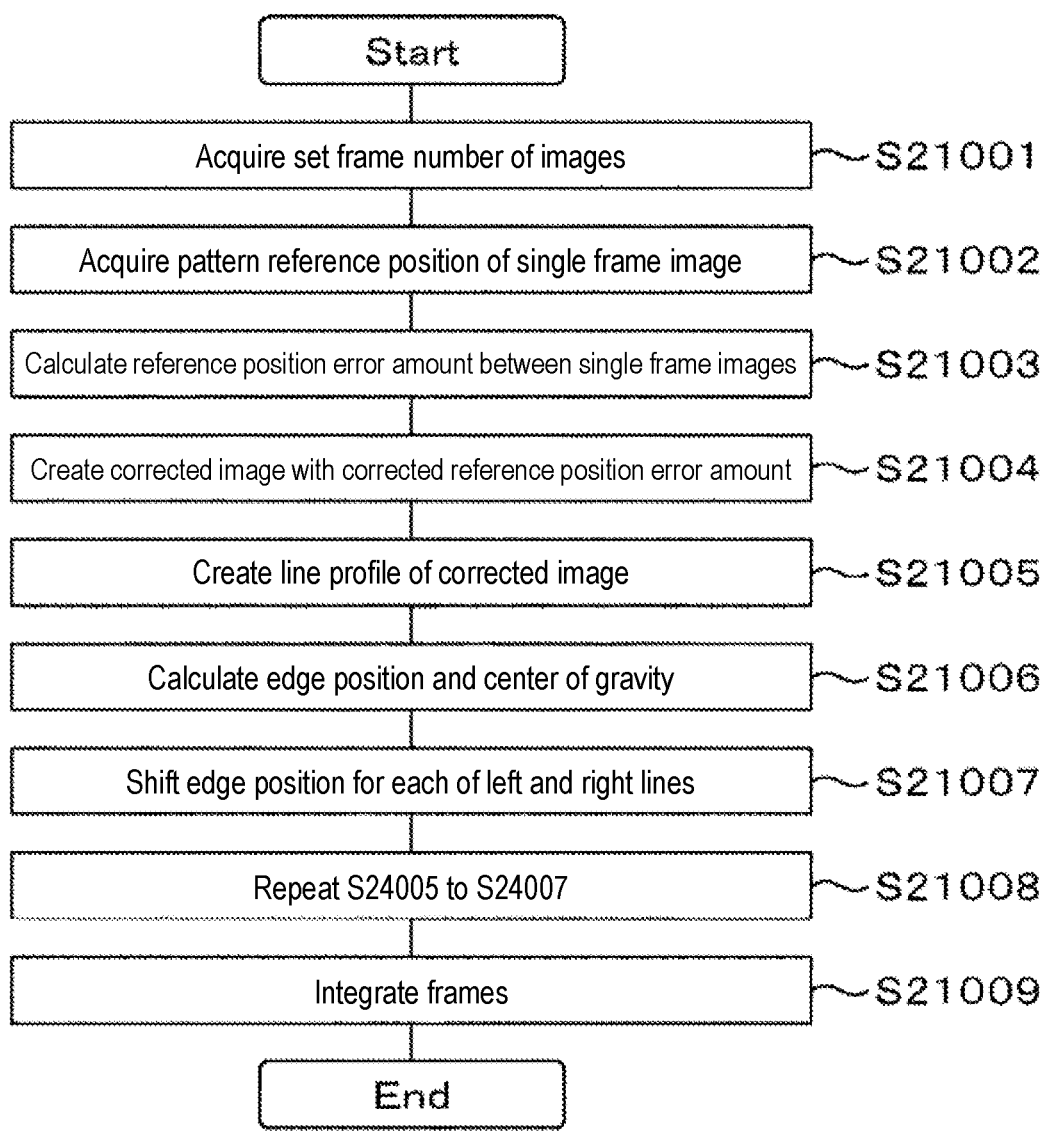
FIG. 21 is a flow chart of a method for creating a composed image in which a position displacement is corrected by detecting a position displacement due to drift and an edge position displacement due to shrinkage.

An embodiment in which a position displacement of an image having a drift and shrinking is corrected by drift correction technology will be described. In this example, when a composed image is generated by integrating TV scan images using a resist pattern that causes a drift due to charge-up, the composed image is influenced by the position displacement due to the drift and shrinkage, resulting in a significant decrease in measurement accuracy. The process flow of the present embodiment is illustrated in FIG. 21 and will be described below.

First Step (S21001):

When image acquisition is started, a single frame image is captured into the image memory 25.

Second Step (S21002):

A reference position for the pattern of the single frame image is acquired. As the reference position, a position that is not subject to the influence of shrinkage is set. For example, when shrinkage occurs, although the edges may become contracted from the pattern center, the pattern center position is not varied. Thus, the reference position may be the center of the pattern or the center of gravity. A line profile may be created, and the center of gravity of the profile may be set as the reference position.

Third Step (S21003):

The amount of displacement in reference position between the single frame images is calculated. The detected amount of position displacement is accumulated with the amount of position displacement from the first frame image. In a pattern illustrated in FIG. 22 where a drift and an edge shrinking have occurred in the single frame image acquired by a plurality of scans, it is determined how much the reference position has been shifted.

Fourth Step (S21004):

After the position displacement of the reference position is calculated, a single frame image in which the position displacement is corrected is created.

Fifth Step (S21005):

A line profile of the corrected image is created by the computer 40.

Sixth Step (S21006):

The edge position and the center of gravity of the obtained profile are computed. Information of the position and the center of gravity is stored in the computer 40.

Seventh Step (S21007):

Then, the amount of displacement from the profile of the preceding frame that has been stored is calculated to shift the edge position.

Eighth Step (S21008):

The process from S21005 to S2107 is repeated.

Ninth Step (S21009):

The frame images with the left and right edges shifted as described above are averaged, obtaining a composed image.

REFERENCE SIGNS LIST

1 Cathode
2 First anode
3 Second anode
4 Primary electron beam
5, 6 Converging lens 7 Objective lens
8 Aperture plate
9 Scan coil
10 Sample
11 Orthogonal electromagnetic field generating device
12 Secondary signal
13 Secondary signal detector

The invention claimed is:

1. An image forming device comprising a processor that forms an integrated image by integrating a plurality of image signals obtained by a microscope, wherein the processor includes:

a matching processing section that performs a matching process between the plurality of image signals;

an image integration section that integrates a plurality of images for which positioning has been performed by the matching process; and a displacement detection section that detects a displacement between the plurality of image signals, wherein:

the displacement detection section selectively detects the displacement in a specific direction of the integrated image;

the image integration section selectively corrects the displacement in the specific direction;

the displacement detection section selectively detects the displacement in a direction different from the specific direction, between the plurality of image signals of which the displacement in the specific direction has been selectively corrected; and the image integration section forms the integrated image by selectively correcting the displacement in the direction different from the specific direction.

2. The image forming device according to claim 1, wherein the displacement detection section calculates a relative displacement between the plurality of image signals based on a correlation in a case where the image signals are selectively moved in the specific direction or the direction different from the specific direction.

3. The image forming device according to claim 1, wherein the displacement detection section creates an approximation curve with regard to an amount of displacement in the specific direction or the direction different from the specific direction.

4. The image forming device according to claim 1, further comprising a user interface that performs input setting of a shape, structure, and a search range of a pattern included in the image signals, and the displacement detection section selectively detects, based on the input setting, displacement in the specific direction or in a direction different from the specific direction.

5. The image forming device according to claim 4, wherein the image integration section selectively corrects, based on the input setting, displacement in the specific direction or in a direction different from the specific direction.

* * * * *